(12) United States Patent
Bernstein

(10) Patent No.: US 7,946,760 B2
(45) Date of Patent: May 24, 2011

(54) METHOD AND APPARATUS FOR DYNAMIC MEASUREMENT OF ACROSS-CHIP TEMPERATURES

(75) Inventor: Kerry Bernstein, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 12/126,011

(22) Filed: May 23, 2008

(65) Prior Publication Data

US 2009/0290615 A1  Nov. 26, 2009

(51) Int. Cl.
*G01J 5/00* (2006.01)
(52) U.S. Cl. .......................... 374/124; 374/120; 374/137
(58) Field of Classification Search .................. 374/120, 374/124, 137
See application file for complete search history.

(56) References Cited

U.S. PATENT DOCUMENTS

| | | | |
|---|---|---|---|
| 2002/0126732 A1* | 9/2002 | Shakouri et al. | 374/130 |
| 2004/0170215 A1* | 9/2004 | Rossi et al. | 374/183 |
| 2008/0082288 A1* | 4/2008 | Raad | 702/130 |

* cited by examiner

*Primary Examiner* — Lisa M Caputo
*Assistant Examiner* — Mirellys Jagan

(57) ABSTRACT

In one embodiment, the invention is a method and apparatus for dynamic measurement of across-chip temperatures. One embodiment of a method for measuring temperatures across an integrated circuit chip includes generating a plurality of surface images of the integrated circuit chip, deriving power values across the integrated circuit chip from the surface images, computing the temperatures across the integrated circuit chip in accordance with the power values, and outputting the temperatures.

19 Claims, 2 Drawing Sheets

US 7,946,760 B2

METHOD AND APPARATUS FOR DYNAMIC MEASUREMENT OF ACROSS-CHIP TEMPERATURES

BACKGROUND OF THE INVENTION

The present invention relates generally to integrated circuits, and relates more specifically to the measurement of temperature on integrated circuit chips.

The establishment of temperature-dependent transistor mobility variability in complementary metal-oxide-semiconductor (CMOS) chips relies heavily on accurate knowledge of on-chip temperatures, which typically vary across the chip. Temperatures across a chip may cause delay changes, which consume the chip's timing margin and may cause serious circuit-limited delay variability.

To date, there are few reliable methods for capturing high-resolution, dynamic on-chip temperatures. Some conventional solutions require the placement of additional structures (such as ring oscillators) on the chip, which reduces the area and power available to other chip components. Conventional imaging-based techniques (such as infrared imaging) tend to capture temperature in a time-averaged manner and at relatively low resolution. Other conventional methods, such as those involving measuring the thermionic emissivity of fluorescing materials applied to the chip, are not economically efficient for use with large numbers of machine states.

Thus, there is a need in the art for a fine resolution, highly dynamic method and apparatus for measurement of across-chip temperatures.

SUMMARY OF THE INVENTION

In one embodiment, the invention is a method and apparatus for dynamic measurement of across-chip temperatures. One embodiment of a method for measuring temperatures across an integrated circuit chip includes generating a plurality of surface images of the integrated circuit chip, deriving power values across the integrated circuit chip from the surface images, computing the temperatures across the integrated circuit chip in accordance with the power values, and outputting the temperatures.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

In one embodiment, the present invention is a fine resolution, highly dynamic method and apparatus for measurement of across-chip temperatures. Embodiments of the present invention employ non-invasive imaging techniques to capture node voltages on an integrated circuit (IC) chip. Values of power, and, therefore, temperature, can be derived from the voltage information, allowing one to accurately model the performance of the chip.

Figure 1:
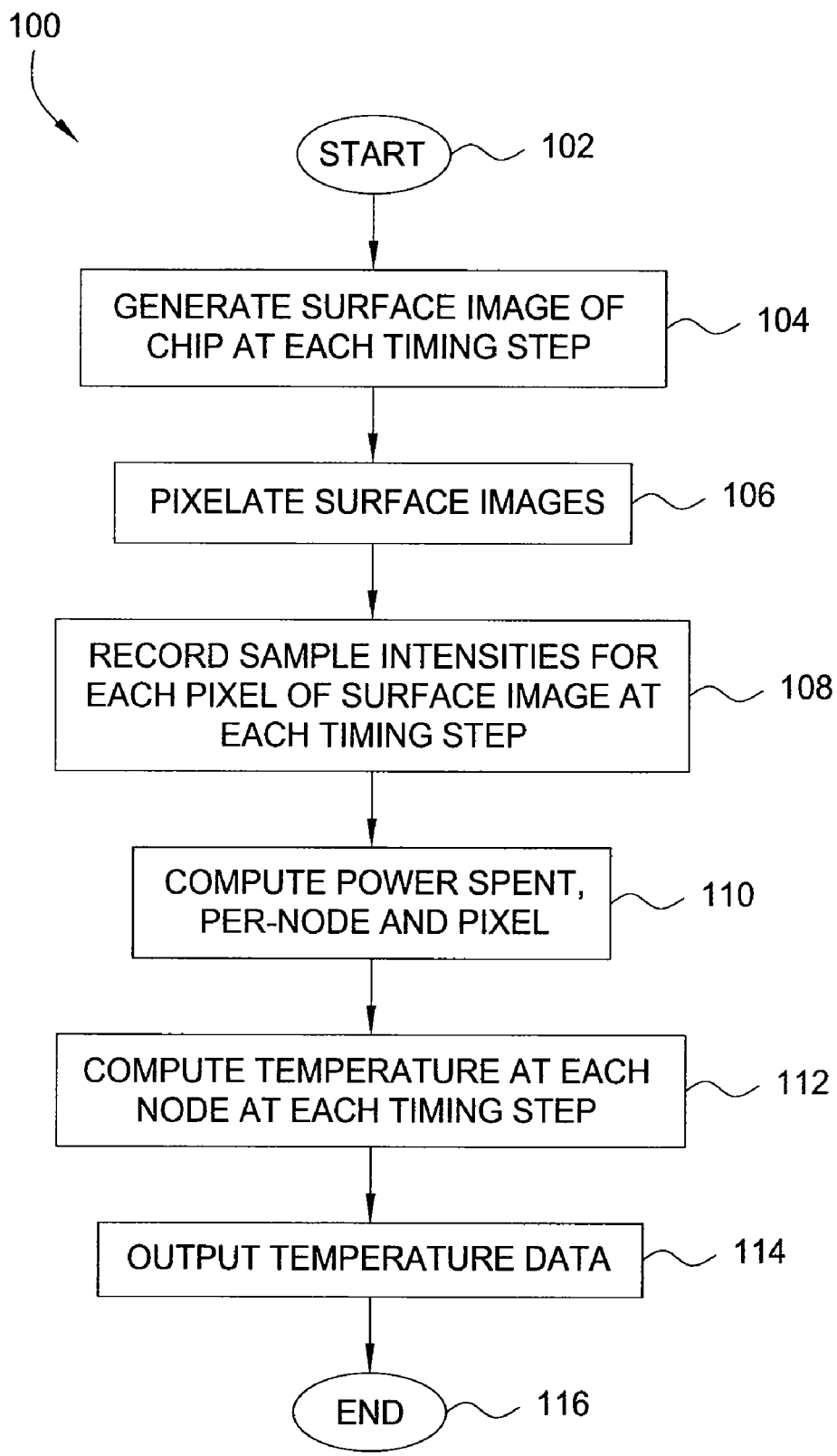
FIG. 1 is a flow diagram illustrating one embodiment of a method for measuring temperatures across an IC chip, according to the present invention.

FIG. 1 is a flow diagram illustrating one embodiment of a method 100 for measuring temperatures across an IC chip, according to the present invention. The method 100 is initialized in step 102 and proceeds to step 104, where the method 100 generates a surface image of the chip at each timing step. In one embodiment, the surface images are generated using a non-invasive imaging technique that is capable of recording node voltages, such as picosecond imaging circuit analysis (PICA) or photo emission microscopy (PEM). For example, PICA captures light emissions occurring during the transition of an N-type metal-oxide-semiconductor field effect transistor (N-MOSFET) from accumulation to saturation (or vice versa). The intensities of these emissions are proportional to the voltages at the nodes in the chip.

In step 106, the method 100 pixelates each regional or chip-wide surface image into a plurality of pixels. The method 100 then proceeds to step 108 and records the sample intensities for each pixel at each timing step, based on the surface images. Visual and infrared PEM typically use cadmium/mercury/telluride backplanes to capture and amplify emissions from the silicon of the IC chip. The gain of such devices is calibrated by wavelength to the energy delivered by the device under test, as described further by Khiam et al. in "A New Fluorescent and Photoemission Microscope for Submicron VLSI IC Failure Analysis," IEEE Conference on Semiconductor Electronics, 2002 (ICSE 2002), which is herein incorporated by reference.

In step 110, the method 100 computes the power spent per-pixel (i.e., per-node of the chip), at each timing step. In one embodiment, the power P liberated per pixel is computed as:

$$P = \tfrac{1}{2} C \Delta V^2 F \qquad \text{(EQN. 1)}$$

where C is the total capacitance to be switched at a given node (and hence at a corresponding pixel), $\Delta V$ is the voltage change observed at the given pixel during a timing step, and F is the frequency. The capacitance C is known from the design loading; thus, if the identity of the node is known, the total capacitance to be switched at the node is also known. The frequency F is one divided by the delay in making the voltage change. A simple thermal representation of the chip's die will give the thermal resistances in and out of the chip, as well as the thermal heat capacities. The power liberated per pixel is then easily modeled as a point-source heat generator using a thermal representation of the die.

In step 112, the method 100 computes the temperature at each pixel, at each timing step. In one embodiment, a field solver is used to convolve the point power sources on the chip into an integrated temperature field. Temperatures computed in this manner are substantially instantaneous. In one embodiment, the field solver used in step 112 is a commercially available mathematical analytic software package, such as the Mathematica software package, commercially available from Wolfram Research, Inc. of Champaign, Ill., or the MathCad software package, commercially available from Parametric Technology Corporation of Needham, Mass.

The method 100 outputs the computed resulting temperatures in step 114 before terminating in step 116. The output temperatures can be used, for example, as the temperature input in a device model to determine pattern-dependent, temperature-induced delay variability. The distribution of on-chip temperatures also allows one to determine the thermally-induced mobility tolerance across-chip.

The method 100 may be especially well-suited for use in determining temperature distributions for general-purpose microprocessor chips. Such chips are capable of performing a plurality of different transactions, each of which will typically stress on-chip resources in a different way (and, consequently, cause different parts of the chip to be heated).

Figure 2:
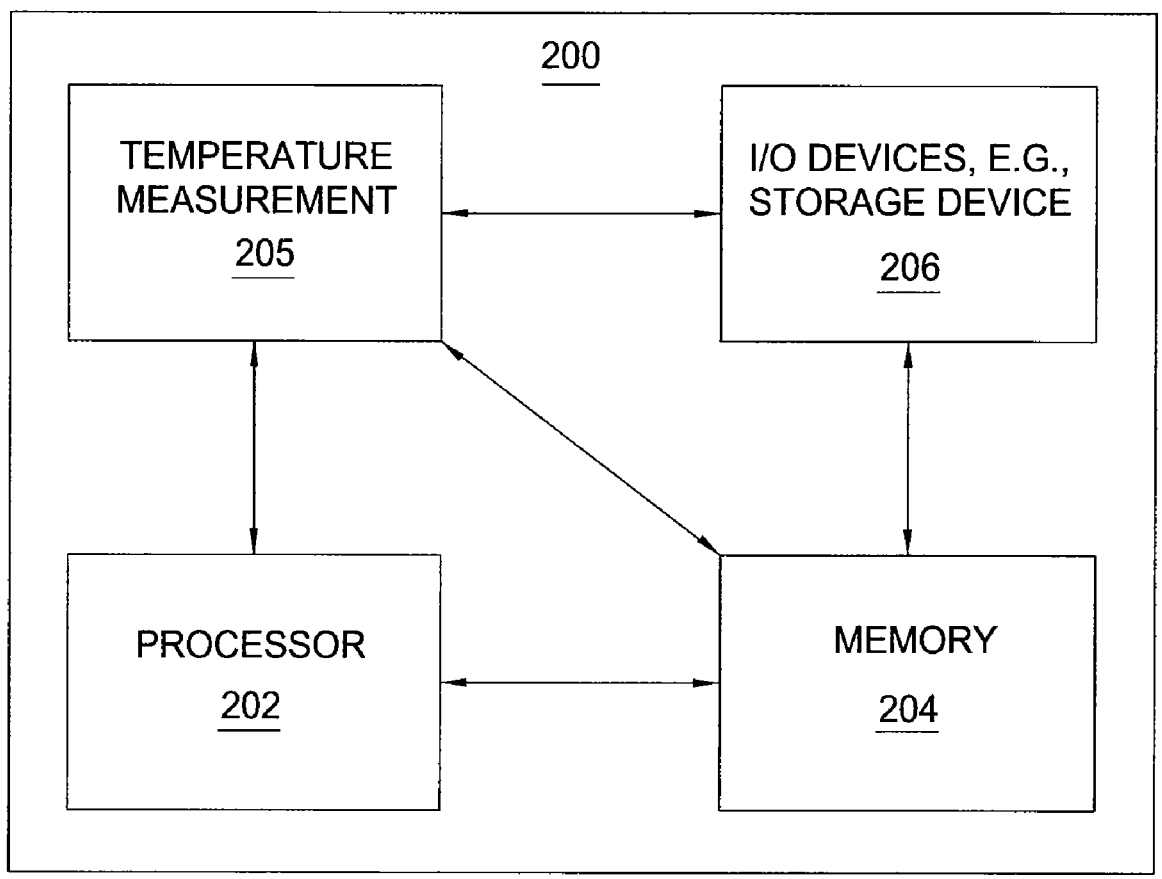
FIG. 2 is a high-level block diagram of the temperature measurement method that is implemented using a general purpose computing device.

FIG. 2 is a high-level block diagram of the temperature measurement method that is implemented using a general purpose computing device 200. In one embodiment, a general purpose computing device 200 comprises a processor 202, a memory 204, a temperature measurement module 205 and various input/output (I/O) devices 206 such as a display, a keyboard, a mouse, a stylus, a wireless network access card, and the like. In one embodiment, at least one I/O device is a storage device (e.g., a disk drive, an optical disk drive, a floppy disk drive). It should be understood that the temperature measurement module 205 can be implemented as a physical device or subsystem that is coupled to a processor through a communication channel.

Alternatively, the temperature measurement module 205 can be represented by one or more software applications (or even a combination of software and hardware, e.g., using Application Specific Integrated Circuits (ASIC)), where the software is loaded from a storage medium (e.g., I/O devices 206) and operated by the processor 202 in the memory 204 of the general purpose computing device 200. Thus, in one embodiment, the temperature measurement module 205 for dynamic measurement of across-chip temperatures, as described herein with reference to the preceding Figures can be stored on a computer readable storage medium or carrier (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for measuring temperatures across an integrated circuit chip, the method comprising:
   generating a plurality of surface images of the integrated circuit chip, wherein the generating comprises pixelating each of the plurality of surface images into a plurality of pixels;
   deriving power values across the integrated circuit chip from the plurality of surface images, wherein the deriving comprises:
      calculating power liberated by each of the plurality of pixels;
   computing the temperatures across the integrated circuit chip in accordance with the power values; and
   outputting the temperatures across the integrated circuit chip.

2. The method of claim 1, further comprising:
   modeling a performance of the integrated circuit chip in accordance with the temperatures across the integrated circuit chip.

3. The method of claim 1, wherein the calculating comprises:
   recording an intensity of each of the plurality of pixels, as captured in the plurality of surface images;
   deriving a voltage at each of the plurality of pixels, in accordance with the intensity;
   obtaining a capacitance to be switched at a node of the integrated circuit chip that corresponds to each of the plurality of pixels; and
   calculating the power liberated by each of the plurality of pixels in accordance with the voltage and capacitance.

4. The method of claim 3, wherein the capacitance is obtained from design data for the integrated circuit chip.

5. The method of claim 1, wherein the temperatures across the integrated circuit chip are computed in accordance with the power liberated by each of the plurality of pixels.

6. The method of claim 5, wherein the temperatures across the integrated circuit chip are computed using a field solver that converts a point power source to a temperature center.

7. The method of claim 1, wherein the generating is performed using an imaging technique that is capable of recording node voltages in the integrated circuit chip.

8. The method of claim 7, wherein the imaging technique comprises a picosecond imaging circuit analysis.

9. The method of claim 7, wherein the imaging technique comprises a photo emission microscopy.

10. A computer readable storage medium containing an executable program for measuring temperatures across an integrated circuit chip, where the program performs steps of:
   generating a plurality of surface images of the integrated circuit chip, wherein the generating comprises pixelating each of the plurality of surface images into a plurality of pixels;
   deriving power values across the integrated circuit chip from the plurality of surface images, wherein the deriving comprises:
      calculating power liberated by each of the plurality of pixels;
   computing the temperatures across the integrated circuit chip in accordance with the power values; and
   outputting the temperatures.

11. The computer readable storage medium of claim 10, further comprising:
   modeling a performance of the integrated circuit chip in accordance with the temperatures across the integrated circuit chip.

12. The computer readable storage medium of claim 10, wherein the calculating comprises:
   recording an intensity of each of the plurality of pixels, as captured in the plurality of surface images;
   deriving a voltage at each of the plurality of pixels, in accordance with the intensity;
   obtaining a capacitance to be switched at a node of the integrated circuit chip that corresponds to each of the plurality of pixels; and
   calculating the power liberated by each of the plurality of pixels in accordance with the voltage and capacitance.

13. The computer readable storage medium of claim 12, wherein the capacitance is obtained from design data for the integrated circuit chip.

14. The computer readable storage medium of claim 10, wherein the temperatures across the integrated circuit chip are computed in accordance with the power liberated by each of the plurality of pixels.

15. The computer readable storage medium of claim 14, wherein the temperatures across the integrated circuit chip are computed using a field solver that converts a point power source to a temperature center.

16. The computer readable storage medium of claim 10, wherein the generating is performed using an imaging technique that is capable of recording node voltages in the integrated circuit chip.

17. The computer readable storage medium of claim 16, wherein the imaging technique comprises a picosecond imaging circuit analysis.

18. The computer readable storage medium of claim 16, wherein the imaging technique comprises a photo emission microscopy.

19. Apparatus for measuring temperatures across an integrated circuit chip, the apparatus comprising:
   means for generating a plurality of surface images of the integrated circuit chip, wherein the means for generating pixelates each of the plurality of surface images into a plurality of pixels;
   means for deriving power values across the integrated circuit chip from the plurality of surface images, wherein the means for deriving calculates power liberated by each of the plurality of pixels;
   means for computing the temperatures across the integrated circuit chip in accordance with the power values; and
   means for outputting the temperatures.

* * * * *